US009666281B2

(12) United States Patent
Sakakibara

(10) Patent No.: US 9,666,281 B2
(45) Date of Patent: May 30, 2017

(54) THREE-DIMENSIONAL P-I-N MEMORY DEVICE AND METHOD READING THEREOF USING HOLE CURRENT DETECTION

(71) Applicant: SANDISK TECHNOLOGIES INC., Plano, TX (US)

(72) Inventor: Kiyohiko Sakakibara, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/707,459

(22) Filed: May 8, 2015

(65) Prior Publication Data
US 2016/0329101 A1    Nov. 10, 2016

(51) Int. Cl.
*H01L 21/28* (2006.01)
*H01L 27/115* (2006.01)
(Continued)

(52) U.S. Cl.
CPC ........ *G11C 16/0483* (2013.01); *G11C 16/045* (2013.01); *H01L 21/28273* (2013.01);
(Continued)

(58) Field of Classification Search
CPC ................ H01L 21/223; H01L 27/115; H01L 27/11582; H01L 27/1157; H01L 27/11565;
(Continued)

(56) References Cited

U.S. PATENT DOCUMENTS 5,915,167 A    6/1999 Leedy
7,005,350 B2    2/2006 Walker et al.
(Continued)

FOREIGN PATENT DOCUMENTS

KR    20100109745 A    10/2010
KR    20110021444 A    3/2011
WO    WO02/15277 A2    2/2002

OTHER PUBLICATIONS

U.S. Appl. No. 14/136,103, filed Dec. 20, 2013, Takaki.
(Continued)

*Primary Examiner* — Fazli Erdem
(74) *Attorney, Agent, or Firm* — The Marbury Law Group PLLC

(57) ABSTRACT

A p-i-n junction structure is formed within a memory film laterally surrounded by an alternating plurality of electrically insulating layers and electrically conductive layers to provide a three-dimensional memory structure. The p-i-n junction includes a lower junction between an intrinsic semiconductor channel portion and a lower doped semiconductor portion and an upper junction between the intrinsic semiconductor channel portion and an upper doped semiconductor portion. The memory film can be subsequently formed on a sidewall of the memory opening, and the intrinsic semiconductor channel portion can be deposited on the memory opening and the lower doped semiconductor portion. The upper doped semiconductor portion can be formed above a topmost electrically conductive layer. The lower doped semiconductor portion can provide hole charge carriers for electrical current.

10 Claims, 18 Drawing Sheets

(51) Int. Cl.
  *H01L 29/423* (2006.01)
  *G11C 16/04* (2006.01)
  *H01L 27/11556* (2017.01)
  *H01L 27/11582* (2017.01)
  *H01L 27/1157* (2017.01)

(52) U.S. Cl.
  CPC .... *H01L 21/28282* (2013.01); *H01L 27/1157* (2013.01); *H01L 27/11556* (2013.01); *H01L 27/11582* (2013.01); *H01L 29/42328* (2013.01); *H01L 29/42344* (2013.01)

(58) Field of Classification Search
  CPC ............... H01L 21/28; H01L 21/28273; H01L 21/28282; H01L 27/11556; H01L 29/423; H01L 29/42328; H01L 29/42344
  See application file for complete search history.

(56) References Cited

U.S. PATENT DOCUMENTS

| | | | |
|---|---|---|---|
| 7,023,739 | B2 | 4/2006 | Chen et al. |
| 7,129,538 | B2 | 10/2006 | Lee et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,764,534 | B2 | 7/2010 | Thorp et al. |
| 7,808,038 | B2 | 10/2010 | Mokhlesi et al. |
| 7,825,455 | B2 | 11/2010 | Lee et al. |
| 7,846,782 | B2 | 12/2010 | Maxwell et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,932 | B2 | 5/2012 | Nguyen et al. |
| 8,394,716 | B2 | 3/2013 | Hwang et al. |
| 8,520,425 | B2 | 8/2013 | Xiao et al. |
| 2003/0062574 | A1 | 4/2003 | Hsieh |
| 2007/0210338 | A1 | 9/2007 | Orlowski |
| 2007/0252201 | A1 | 11/2007 | Kito et al. |
| 2009/0003082 | A1 | 1/2009 | Meeks et al. |
| 2009/0230449 | A1 | 9/2009 | Sakaguchi et al. |
| 2010/0013049 | A1 | 1/2010 | Tanaka et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0254191 | A1 | 10/2010 | Son et al. |
| 2010/0320528 | A1 | 12/2010 | Jeong et al. |
| 2011/0031546 | A1 | 2/2011 | Uenaka et al. |
| 2011/0076819 | A1 | 3/2011 | Kim et al. |
| 2011/0133606 | A1 | 6/2011 | Yoshida et al. |
| 2011/0169071 | A1 | 7/2011 | Uenaka |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0147648 | A1 | 6/2012 | Scheuerlein |
| 2013/0107602 | A1 | 5/2013 | Oh et al. |
| 2013/0264631 | A1 | 10/2013 | Alsmeier et al. |
| 2013/0313627 | A1 | 11/2013 | Lee |
| 2014/0264548 | A1 | 9/2014 | Lee et al. |
| 2016/0204122 | A1* | 7/2016 | Shoji ................. H01L 27/11582 257/324 |
| 2016/0240665 | A1* | 8/2016 | Chen .................. H01L 29/0847 |

OTHER PUBLICATIONS

U.S. Appl. No. 14/224,290, filed Mar. 25, 2014, Takaki.
U.S. Appl. No. 14/150,162, filed Jan. 8, 2014, Takaki et al.
U.S. Appl. No. 14/206,196, filed Mar. 12, 2014, Takaki.
Invitation to Pay Additional Search Fees issued in PCT Application No. PCT/US13/41410, mailed Sep. 9, 2013.(6 pp.).
International Search Report & Written Opinion, PCT/US2011/042566, Jan. 17, 2012 (30 pp.).
Invitation to Pay Additional Fees & Partial International Search Report, PCT/US2011/042566, Sep. 28, 2011. (7 pp.).
Endoh, T.et al., titled "Novel Ultra High Density Memory With a Stacked-Surrounding Gate Transistor (S-SGT) Structured Cell", IEDM Proc. (2001) 33-36.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Kimura, Masahide "3D Cells Make Terabit NAND Flash Possible," Nikkei Electronics Asia, Sep. 17, 2009, 6pgs.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.
Lue, H.T. et al., A Novel Dual-Channel 3D NAND Flash Featuring both N-Channel and P-Channel NAND Characteristics for Bit-alterable Flash Memory and a New Opportunity in Sensing the Stored Charge in the WL Space, IEEE, IEDMI 13-82, pp. 3.7.1-3.7.4, (2013).
The International Search Report and Written Opinion of the International Searching Authority for International Application No. PCT/US2016/028445, 19 pages, dated Aug. 25, 2016.
Invitation to Pay Additional Fees and Communication Relating to the Results of the Partial International Search for International Application No. PCT/US2016/028445, 7 pages, dated Jul. 4, 2016.

\* cited by examiner

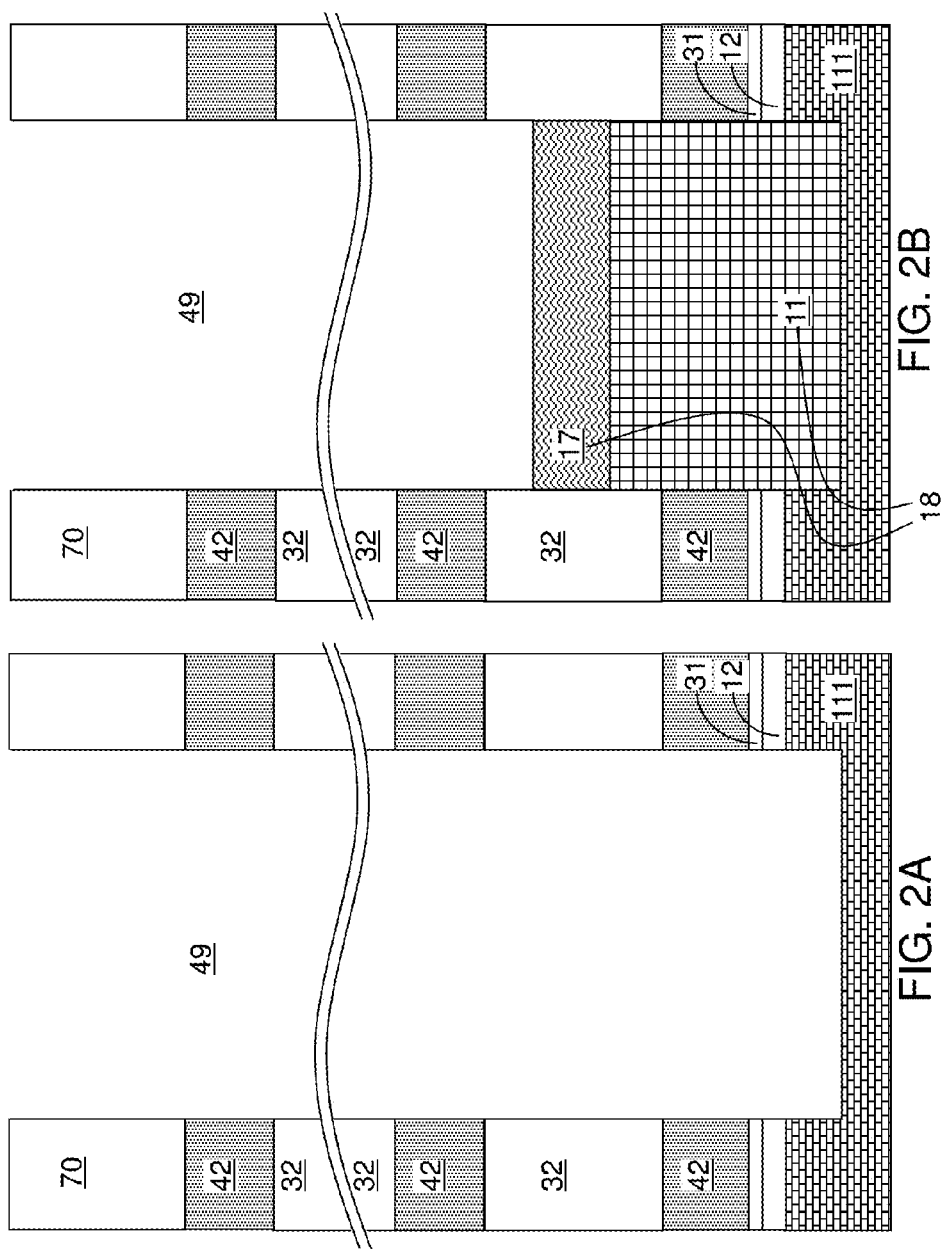

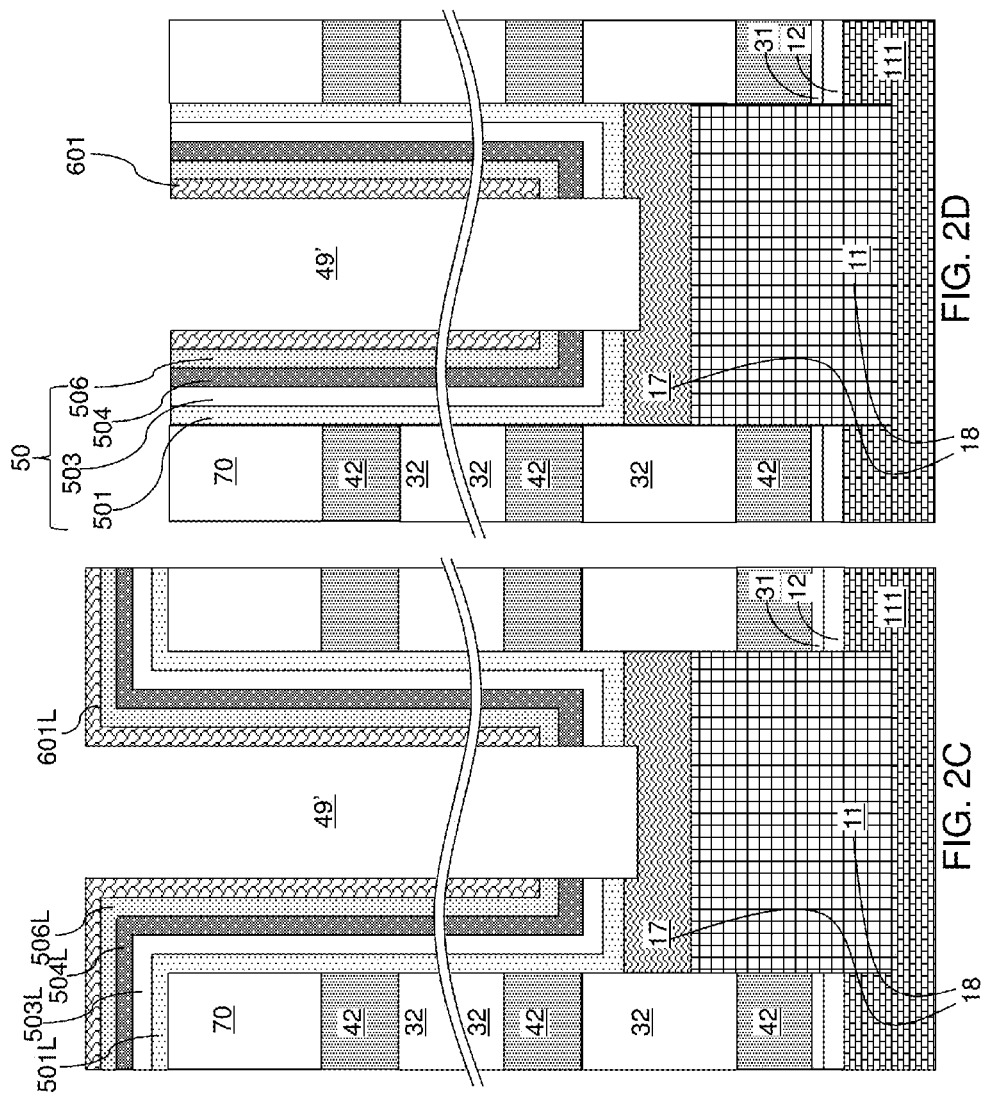

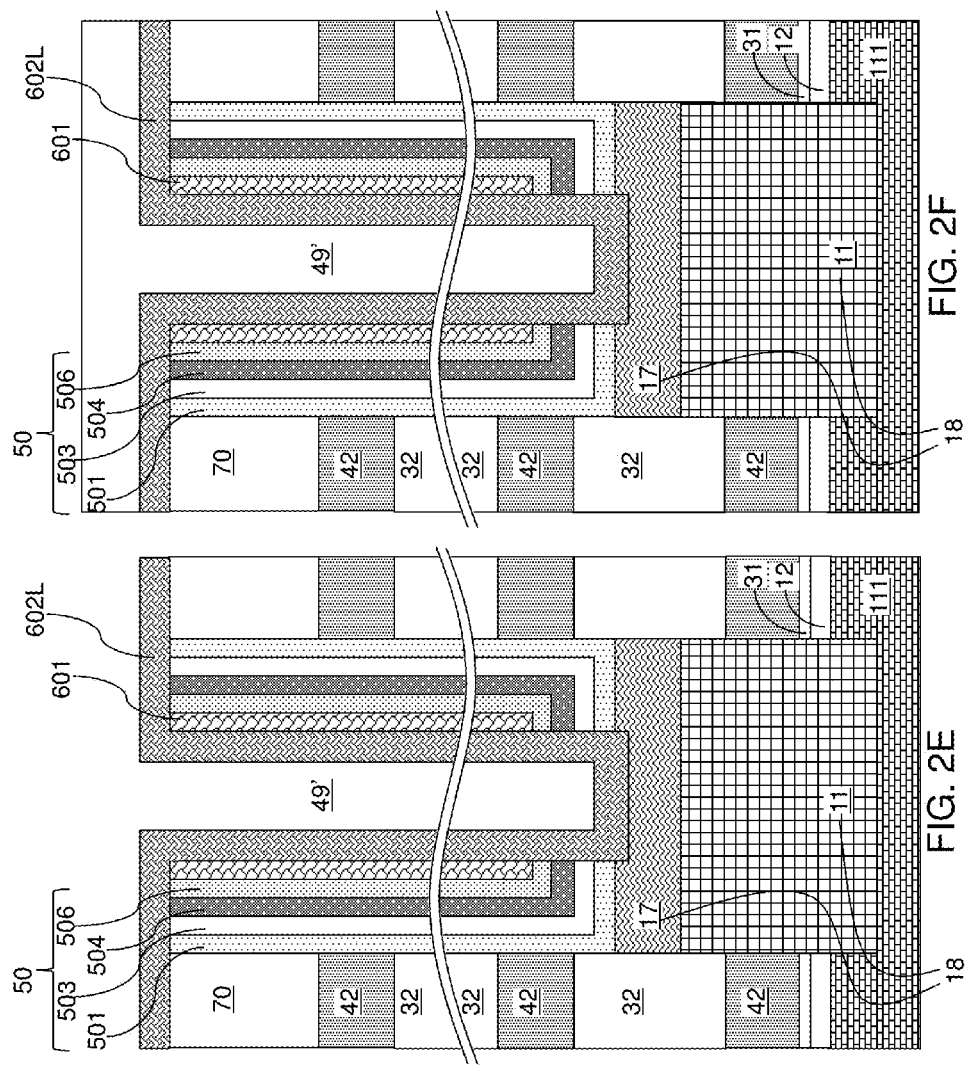

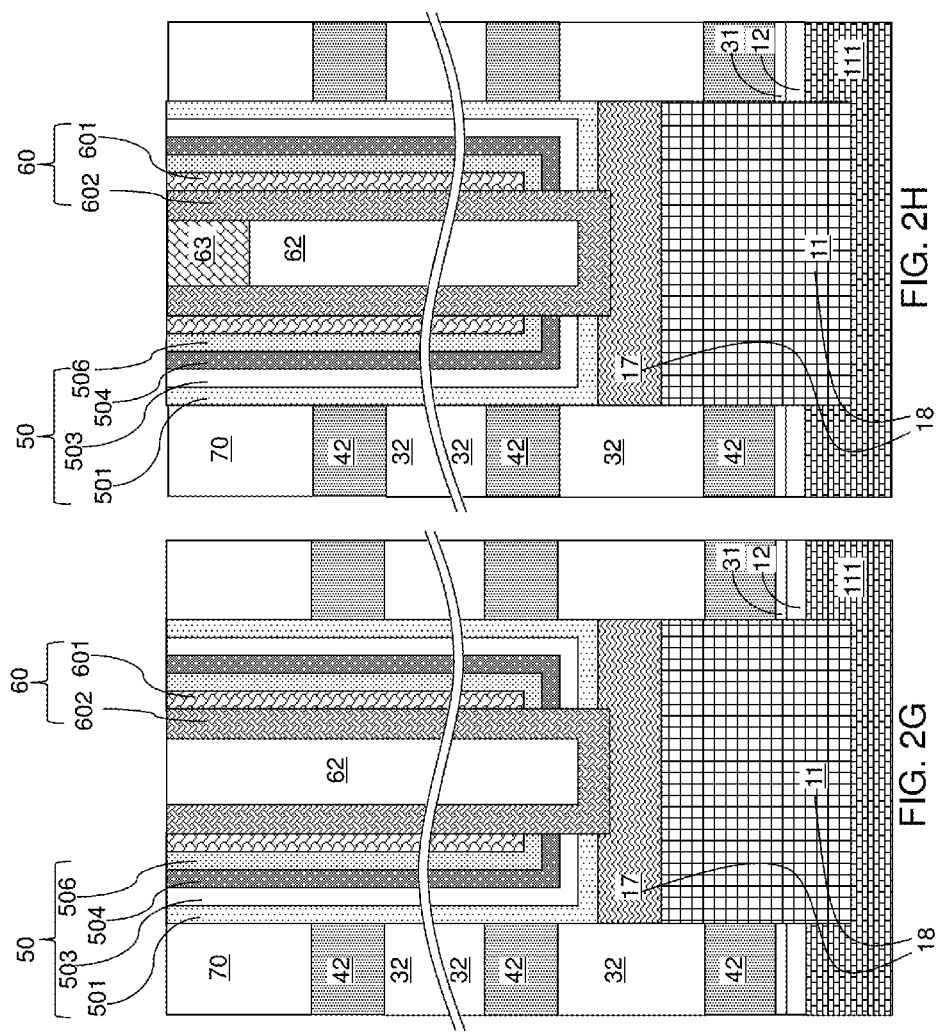

THREE-DIMENSIONAL P-I-N MEMORY DEVICE AND METHOD READING THEREOF USING HOLE CURRENT DETECTION

FIELD

The present disclosure relates generally to the field of semiconductor devices and specifically to three-dimensional semiconductor devices, such as vertical NAND strings, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises a stack of alternating layers comprising insulating layers and electrically conductive layers and located over a substrate, and a memory stack structure extending through the stack and comprising a memory film and a semiconductor p-i-n junction structure vertically extending through the stack substantially perpendicular to a top surface of the substrate. The semiconductor p-i-n junction structure has a lower junction between an intrinsic semiconductor portion and a lower doped semiconductor portion having a doping of a first conductivity type, and an upper junction between the intrinsic semiconductor portion and an upper doped semiconductor portion having a doping of a second conductivity type. One of the first and second conductivity types is p-type and another of the first and second conductivity types is n-type.

According to another aspect of the present disclosure, a method of reading a nonvolatile memory device comprises providing a nonvolatile memory device comprising a plurality of charge storage elements located between a semiconductor p-i-n junction structure and a plurality of gate electrodes, and reading data stored in the plurality of charge storage elements by measuring a hole current passing through the semiconductor p-i-n junction structure.

According to another aspect of the present disclosure, a method of manufacturing a memory device is provided. A stack of alternating layers comprising first material layers and second material layers is formed over a substrate. A memory opening is formed through the stack of alternating layers to a top surface of the substrate. A lower doped semiconductor portion having a doping of a first conductivity type is formed at a lower portion of the memory opening. A memory film is formed on a sidewall of the memory opening. An intrinsic semiconductor channel portion is formed on the lower doped semiconductor portion and the memory film. An upper doped semiconductor portion having a doping of a second conductivity type is formed on the intrinsic semiconductor portion. One of the first and second conductivity types is p-type and another of the first and second conductivity types is n-type.

BRIEF DESCRIPTION OF THE DRAWINGS

FIGS. 2A-2H are sequential vertical cross-sectional views of a memory opening within the exemplary structure during various processing steps employed to form a memory stack structure according to the first embodiment of the present disclosure.

DETAILED DESCRIPTION

Figure 1:
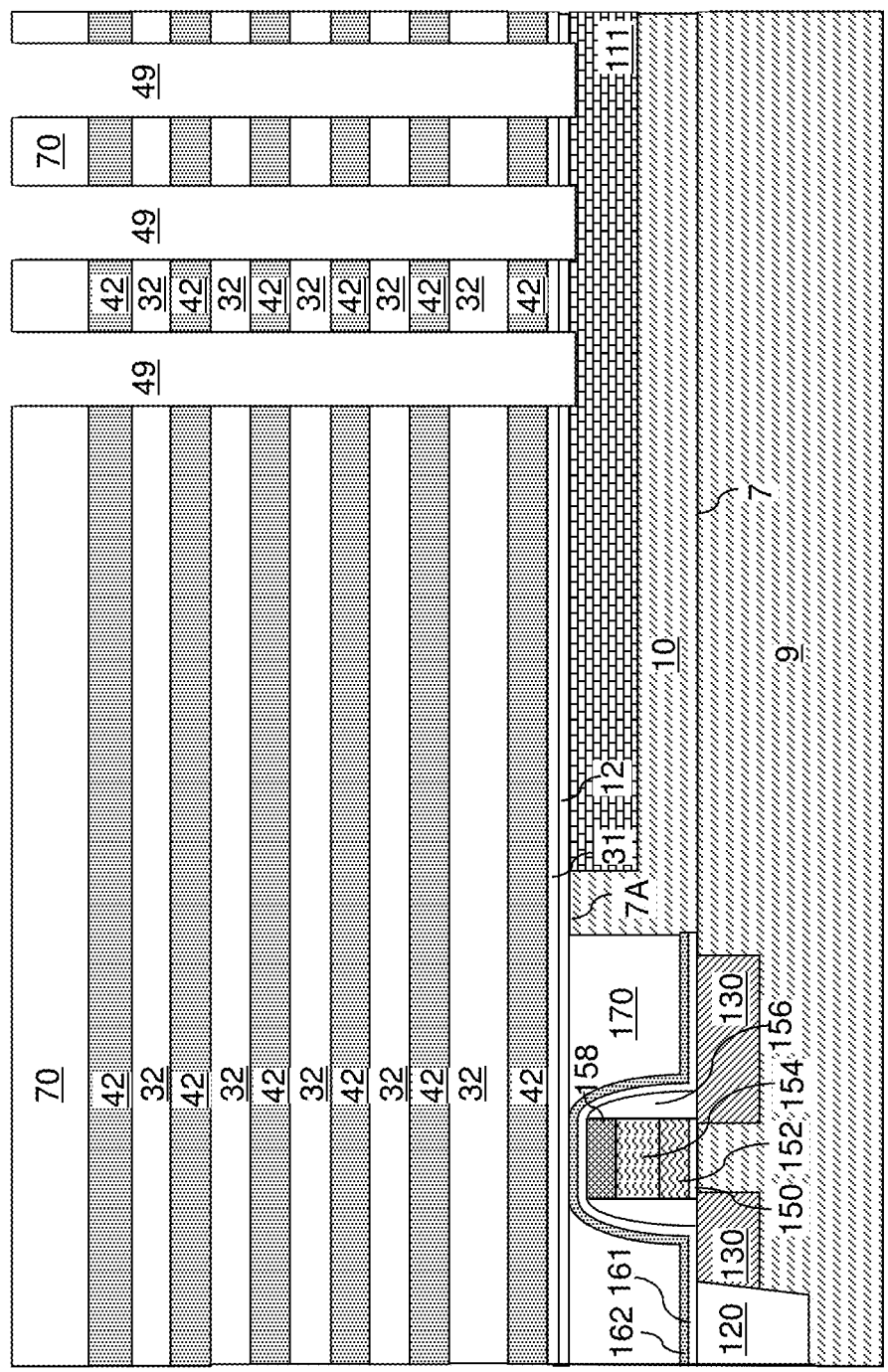
FIG. 1 is a vertical cross-sectional view of an exemplary structure after formation of a stack including an alternating plurality of material layers and memory openings extending through the stack according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to the first embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical resistivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. A material is "semiconducting" if the electrical conductivity is in a range from $1.0 \times 10^{-6}$ S/cm to $1.0 \times 10^5$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 having a top surface 7A can be formed on the top surface 7 of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

A doped semiconductor well 111 is formed in an upper portion of the substrate (9, 10). If a semiconductor material layer 10 is present in an upper portion of the substrate (9, 10), the doped semiconductor well 111 can be formed in an upper portion of the semiconductor material layer 10. If the substrate does not include a semiconductor material layer and the topmost surface of the substrate is a surface of the substrate semiconductor layer 9, the doped semiconductor well 111 is formed in an upper portion of the substrate semiconductor layer 9.

The doped semiconductor well 111 can be formed by implantation or diffusion of electrical dopants of a first conductivity type (e.g., p-type or n-type, preferably p-type). The first conductivity type is the conductivity type of the topmost semiconductor layer in the substrate (9, 10). For example, if the substrate (9, 10) comprises the semiconductor material layer 10, the semiconductor material layer 10 and the doped semiconductor well 111 have a doping of the first conductivity type. If the topmost layer of the substrate is the substrate semiconductor layer 9 (i.e., the substrate does not include a semiconductor material layer), the substrate semiconductor layer 9 and the doped semiconductor well 111 have a doping of the first conductivity type. In other words, the doped semiconductor well 111 can be formed by implantation of electrical dopants of the same conductivity type as the doping of the topmost semiconductor material layer in the substrate (9, 10).

The well 111 may be a lightly or heavily well. In one embodiment, the well may be a heavily doped well having a concentration of electrical in a range from $1.0 \times 10^{18}/cm^3$ to $2.0 \times 10^{21}/cm^3$, although lesser and greater dopant concentrations can also be employed. In one embodiment, the concentration of electrical dopants of the first conductivity type in the doped semiconductor well 111 can be in a range from $5.0 \times 10^{19}/cm^3$ to $2.0 \times 10^{21}/cm^3$. The concentration of electrical dopants of the first conductivity type in the layer embedding the doped semiconductor well 111 (which can be the semiconductor material layer 10 or the substrate semiconductor layer 9) can be in a range from $1.0 \times 10^{15}/cm^3$ to $1.0 \times 10^{18}/cm^3$.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2H illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 1.

Referring to FIG. 2A, a memory opening 49 in the exemplary structure of FIG. 1 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial pedestal 11 can be formed at the bottom portion of each memory opening 49, for example, by selective epitaxy. The epitaxial pedestal 11 is formed at a bottom of the memory opening 49 by depositing a single crystalline semiconductor material on the physically exposed surface of the substrate (9, 10, 111) employing a selective epitaxial deposition process. The physically exposed surface of the substrate (9, 10, 111) can comprise a recessed top surface and sidewalls of the doped semiconductor well 111. The epitaxial pedestal 11 comprises a single crystalline semiconductor material in epitaxial alignment with the single crystalline semiconductor material of the doped semiconductor well 111. In one embodiment, the epitaxial pedestal 11 can be doped with electrical dopants of the same conductivity type as the doped semiconductor well 111. In one embodiment, the doped semiconductor well 111 can have a doping of the first conductivity type at a first dopant concentration, and the epitaxial pedestal 11 can be formed directly on the doped semiconductor well 111 with a doping of the first conductivity type at a second dopant concentration that is less than the first dopant concentration. In one embodiment, the epitaxial pedestal 11 may be lightly doped (e.g., p-doped) having a concentration of electrical dopants of the first conductivity type in range from $1.0 \times 10^{15}/cm^3$ to $1.0 \times 10^{18}/cm^3$.

In one embodiment, the top surface of each epitaxial pedestal 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial pedestals 11 with a respective conductive material layer.

Electrical dopants of the first conductivity type can be doped (e.g., implanted or diffused) into an upper region of the epitaxial pedestal 11. The implanted region of the epitaxial pedestal 11 is herein referred to as a lower doped semiconductor portion 17. The epitaxial pedestal 11 comprises deposited single crystalline semiconductor material. Thus, a portion of the epitaxial pedestal 11 is converted into the lower doped semiconductor portion 17 by implanting electrical dopants of the first conductivity type into an upper portion of the deposited single crystalline semiconductor material. The remaining portion of the epitaxial portion 11 has a doping of the first conductivity type at a lower dopant concentration than the lower doped semiconductor portion 17, which has a doping of the first conductivity type. The lower doped semiconductor portion 17 may be heavily doped (e.g., p+ doped) and a concentration of electrical dopants of the first conductivity type in the lower doped semiconductor portion 17 can be a range from $1.0 \times 10^{15}/cm^3$ to $1.0 \times 10^{18}/cm^3$.

The energy of the ion implantation can be selected such that the top surface and the bottom surface of the lower doped semiconductor portion 17 can be located between a first horizontal plane including a top surface of an insulator layer 32 and a second horizontal plane including a bottom surface of the insulator layer 32. Thus, the lower doped semiconductor portion 17 is formed at a lower portion of the memory opening 49. Because the electrical dopants of the first conductivity type are not implanted into a lower portion of the epitaxial pedestal 11 during formation of the lower doped semiconductor portion 17, the lower portion of the epitaxial pedestal 11 that is not converted into the lower doped semiconductor portion 17 remains lightly doped and has a doping of the first conductivity type at a lower dopant concentration than the lower doped semiconductor portion 17 after formation of the lower doped semiconductor portion 17.

Referring to FIG. 2C, a series of layers including at least one blocking dielectric layer (501L, 503L), a memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 506L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes an intrinsic semiconductor material can be formed. As used herein, an "intrinsic" semiconductor material refers to a semiconductor material that does not include any electrical dopant atoms, or a semiconductor material that includes electrical dopant atoms at an atomic concentration less than $1.0 \times 10^{15}/cm^3$. Thus, the first semiconductor channel layer 601L may include no electrical dopants, may include electrical dopants of the first conductivity type (e.g., p-type) at a dopant concentration less than $1.0 \times 10^{15}/cm^3$.

The first semiconductor channel layer 601L includes can comprise at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 5061, 601L).

Referring to FIG. 2D, the optional first semiconductor channel layer 601L, the tunneling dielectric layer 506L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial pedestal 11 can be physically exposed underneath the opening through the first semiconductor channel portion 601, the tunneling dielectric 506, the charge storage element 504, and the at least one blocking dielectric (501, 503). Optionally, the physically exposed portion of the epitaxial pedestal 11 can be vertically recessed. A tunneling dielectric 506 is embedded within a charge storage element 504. The charge storage element 504 can comprise a charge trapping material or a floating gate material.

The set of the tunneling dielectric 506, the charge storage element 504, the second blocking dielectric 503, and the first blocking dielectric 501 collectively constitutes a memory film 50. In one embodiment, the first semiconductor channel portion 601, the tunneling dielectric 506, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the lower doped semiconductor portion 17 over the substrate (9, 10), and directly on the first semiconductor channel portion 601. The second semiconductor channel layer 602L includes an intrinsic semiconductor material, i.e., a semiconductor material not including electrical dopants or including electrical dopants at an atomic concentration not greater than $1.0 \times 10^{15}/cm^3$. The intrinsic semiconductor material of the second semiconductor channel layer 602L can be any of the intrinsic semiconductor material that can be employed for the first semiconductor channel layer 601L.

The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L. The entirety of the semiconductor channel material can be an intrinsic semiconductor portion, i.e., a portion of an intrinsic semiconductor material. In case the intrinsic semiconductor material of the first and second semiconductor channel layers (601L, 602L) can be formed by deposition of at least one polycrystalline semiconductor material such as polysilicon, and/or can be formed by deposition of at least one amorphous semiconductor material such as amorphous silicon and subsequent conversion of the at least one amorphous semiconductor material into at least one polycrystalline semiconductor material. The at least one polycrystalline semiconductor material is herein referred to as a first polycrystalline semiconductor material.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. The semiconductor channel 60 is an intrinsic semiconductor portion. A tunneling dielectric 506 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2H, an upper doped semiconductor portion 63 can be formed by depositing a doped semiconductor material having a doping of a second conductivity type (e.g., n-type) within each recessed region above the dielectric cores 62. The second conductivity type is the opposite of the first conductivity type. The upper doped semiconductor portion 63 may be heavily doped (e.g., n+ doped) and a concentration of dopants of the second conductivity type within the upper doped semiconductor portion 63 can be in a range from $1.0 \times 10^{18}/cm^3$ to $2.0 \times 10^{21}/cm^3$, although lesser and greater concentrations of the dopants of the second conductivity type can also be employed. Thus, one of the first and second conductivity types is p-type and another of the first and second conductivity types is n-type. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the upper doped semiconductor portions 63.

A p-i-n junction structure is formed by the combination of the lower doped semiconductor portion 17 having a doping of the first conductivity type, the intrinsic semiconductor portion as embodied as the semiconductor channel 60 which comprises portions (601, 602), and the upper doped semiconductor portion 63 having a doping of the second conductivity type. The p-i-n junction structure (17, 60, 63) vertically extends through the stack of alternating layers (32, 42) substantially perpendicular (e.g., between 0 and 10 degrees) with respect to the top surface (7, 7A) of the substrate (9, 10). An upper junction is formed between the intrinsic semiconductor portion 60 and the upper doped semiconductor portion 63. A lower junction is formed between the intrinsic semiconductor portion (e.g., channel)

60 and the lower doped semiconductor portion 17. In one embodiment, at least one of the second material layers (such as at least one sacrificial material layer 42) can be formed below a horizontal plane including the lower junction, i.e., the junction between the intrinsic semiconductor portion (601, 602) and the lower doped semiconductor portion 17. Thus, portion 17 functions similar to a source, portion 60 functions similar to a channel and portion 63 functions similar to a drain of a NAND string, even though they form a multi-gated, vertical p-i-n (or n-i-p) diode structure rather than a typical n-i-n or p-i-p structure of a NAND multi-gate transistor.

A memory stack structure 55 is formed within each memory opening 49. Each memory stack structure comprises an epitaxial pedestal 11, a lower doped semiconductor portion 17, a memory film 50, an intrinsic semiconductor portion 60, an upper doped semiconductor portion 63, and an optional dielectric core 62. A combination of an adjoining pair of an epitaxial pedestal 11 and a lower doped semiconductor portion 17 is herein referred to as an epitaxial semiconductor portion 18.

Figure 3:
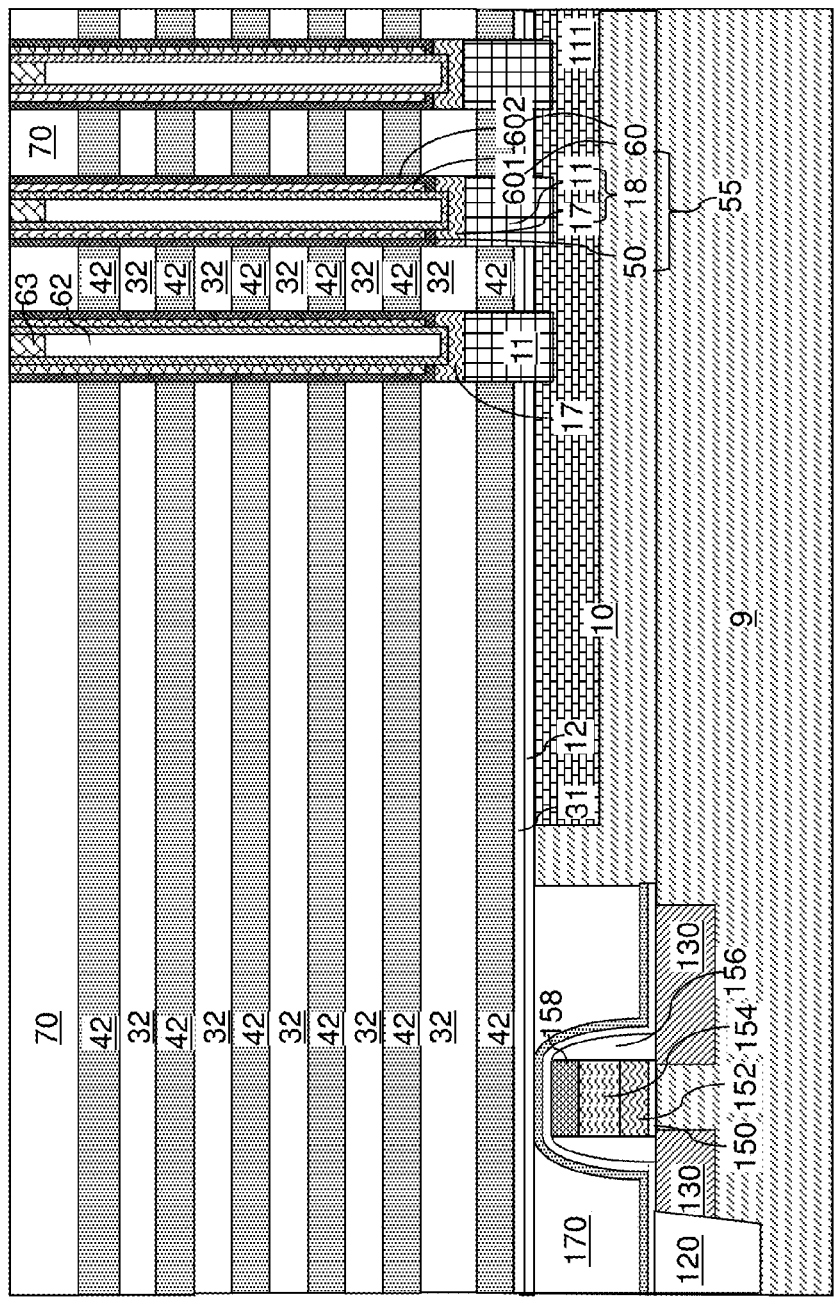
FIG. 3 is a vertical cross-sectional view of the exemplary structure after formation of memory stack structures according to the first embodiment of the present disclosure.

An instance of the exemplary memory stack structure illustrated in FIG. 2H can be embedded into an instance of a memory opening in the exemplary structure of FIG. 1. FIG. 3 illustrates the exemplary structure that incorporates multiple instances of the exemplary memory stack structure of FIG. 2H. The exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
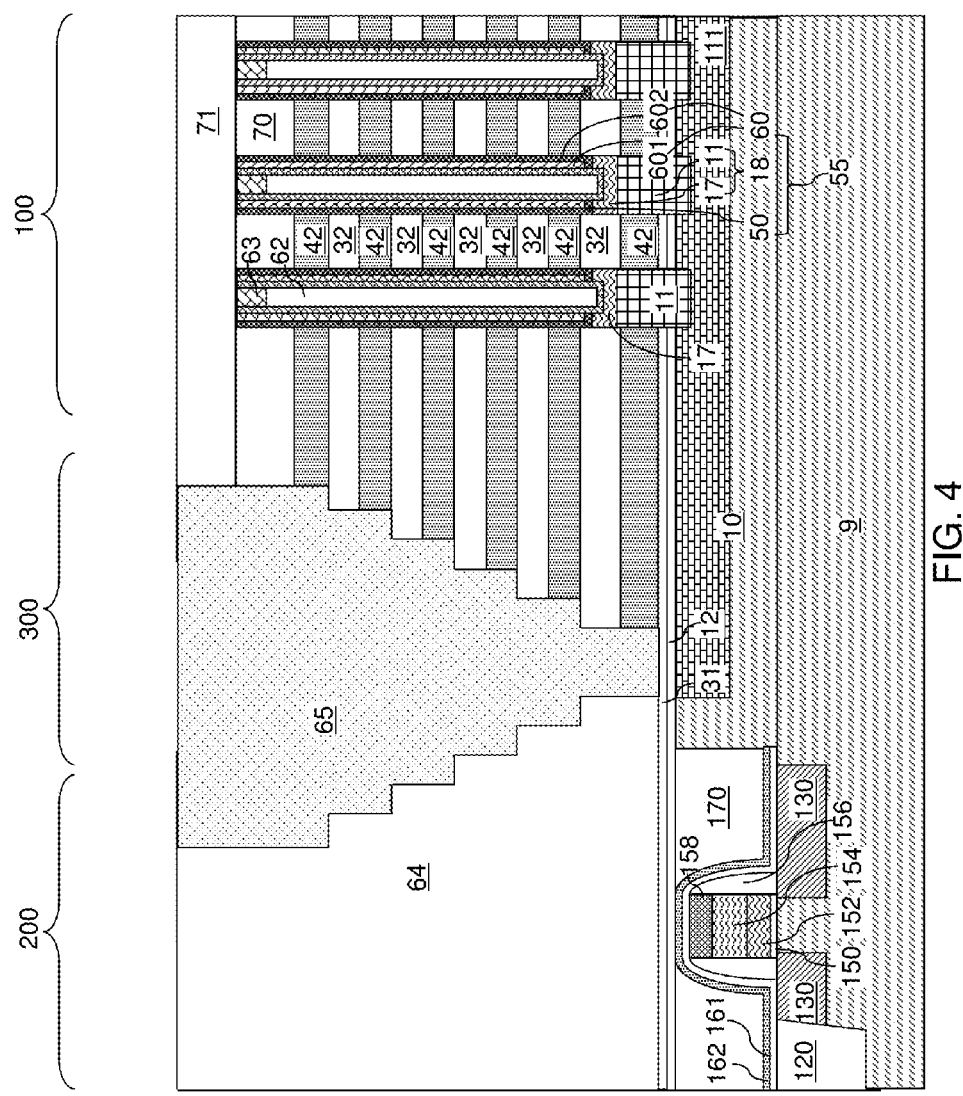
FIG. 4 is a vertical cross-sectional view of the exemplary structure after formation of a stepped terrace and a retro-stepped dielectric material portion according to the first embodiment of the present disclosure.

Referring to FIG. 4, an optional first contact level dielectric layer 71 can be formed over the substrate (9, 10). As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the upper doped semiconductor portions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a memory device region 100 that includes an array of memory stack structures 55. Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
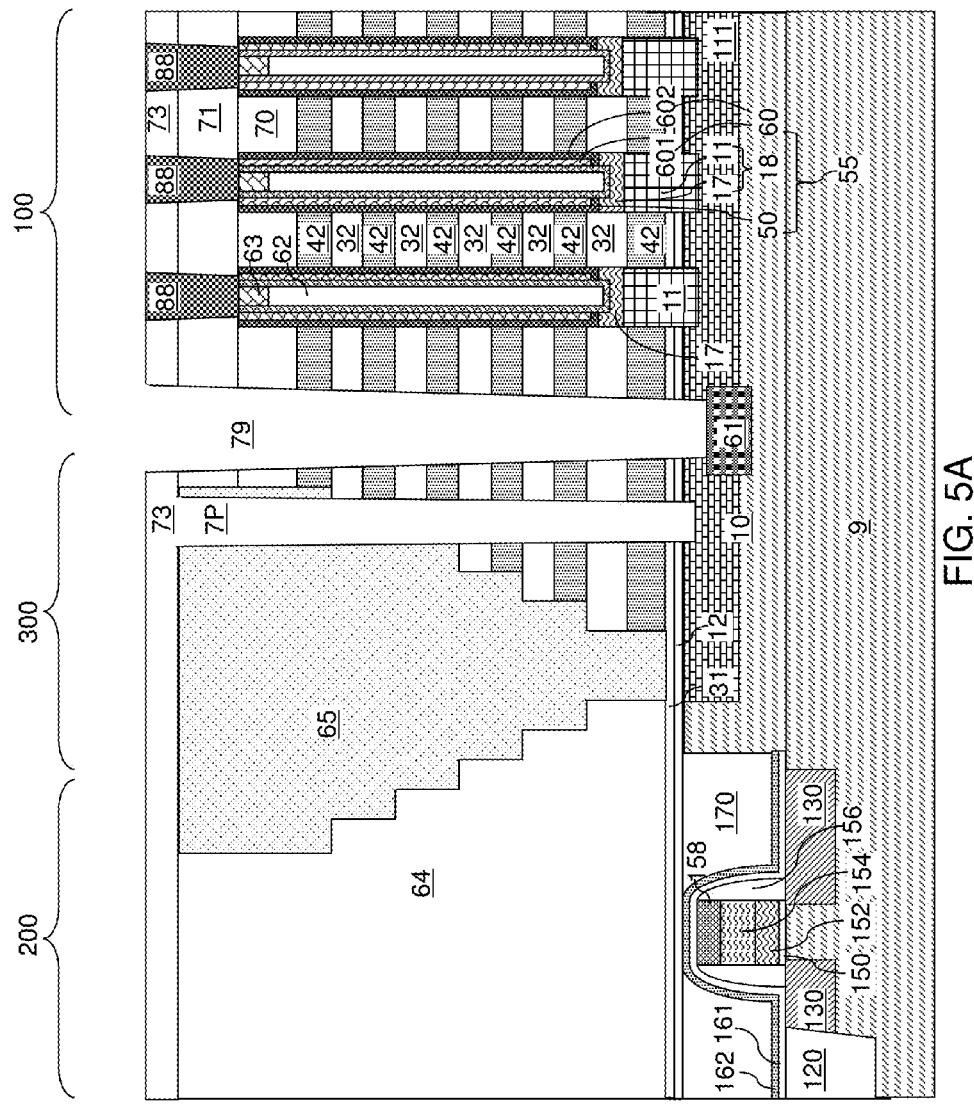
FIG. 5A is a vertical cross-sectional view of the exemplary structure after formation of a backside trench according to the first embodiment of the present disclosure.
Figure 5B:
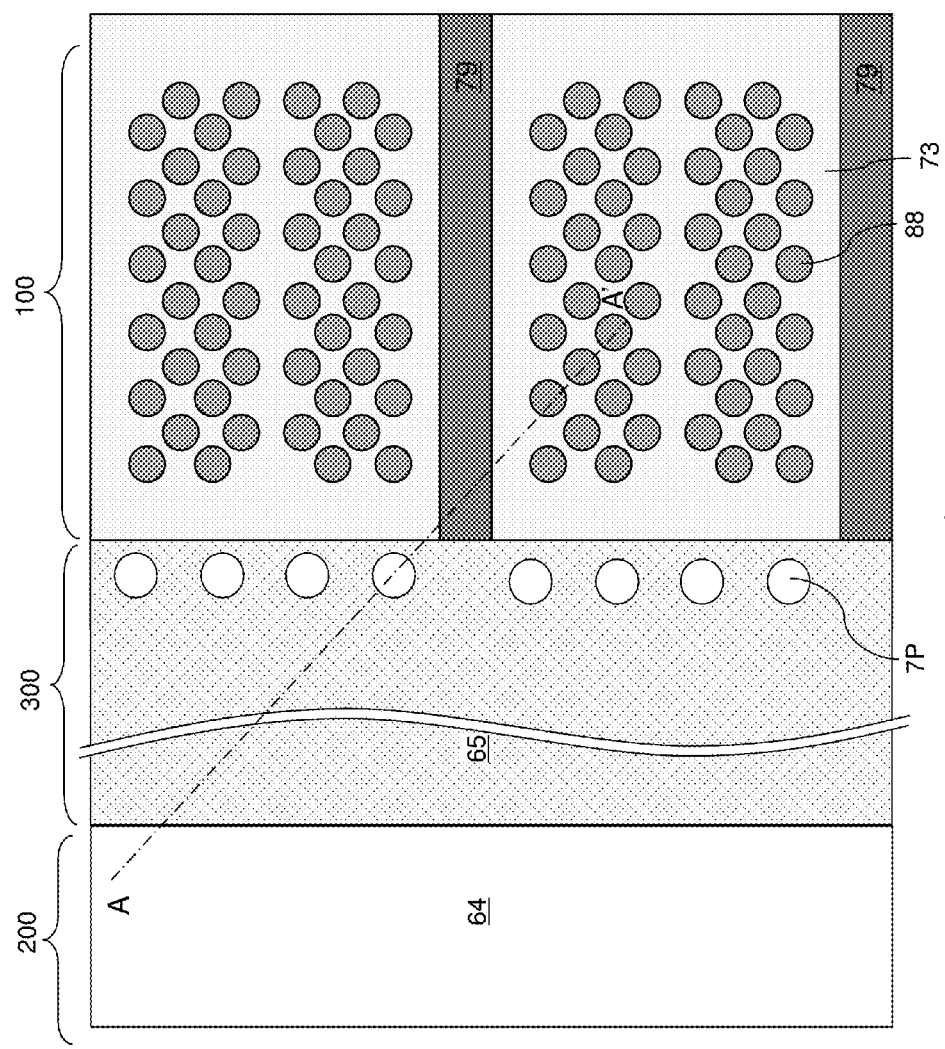
FIG. 5B is a partial see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the first contact level dielectric layer 71 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the memory device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a backside contact via structure.

The second contact level dielectric layer 73 and the at least one dielectric support pillar 7P can be formed as a single contiguous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed.

Optionally, memory contact via structures 88 can be formed through the first and second contact level dielectric layers (73, 71). Alternatively, the structures 88 may be formed at a later stage in the process, such as during the steps shown in FIG. 11. Specifically, a photoresist layer can be applied over the second contact level dielectric layer 73, and can be lithographically patterned to form openings overlying the drain structures 63. An anisotropic etch can be performed to transfer the pattern in the photoresist layer through the first and second contact level dielectric layers (73, 71) to form memory contact via cavities that extend through the first and second contact level dielectric layers (73, 71). The memory contact via cavities can be filled with at least one conductive material. Excess portions of the at least one conductive material can be removed from above a horizontal plane including a top surface of the second contact level dielectric layer 73. Each remaining contiguous portion of the at least one conductive material constitutes a memory contact via structure 88, which contacts a top surface of an underlying upper doped semiconductor portion 63. The photoresist layer can be subsequently removed, for example, by ashing.

Another photoresist layer (not shown) can be applied over the alternating stack (32, 42) and/or the retro-stepped dielectric material portion 65, and optionally over the and lithographically patterned to form at least one backside trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside trench 79, which extends at least to the top surface of the substrate (9, 10). In one embodiment, the at least one backside trench 79 can include a source contact opening in which a source contact via structure can be subsequently formed. A bridging region 61 can be formed by implanting electrical dopants through each backside trench into a semiconductor portion located on, or within, the substrate (9, 10). For example, a bridging region 61 may be formed by diffusion or implantation of dopant atoms into a portion of the semiconductor material layer 10 through each backside trench 79. The bridging region 61 may be heavily doped with dopants of the first conductivity type (e.g., p-type) to assist hole transport in a region that lacks a select gate under an insulating layer 174 that will be formed in a subsequent step shown in FIG. 9. Alternatively, a semiconductor portion can be formed on the substrate (9, 10) by deposition of a semiconductor material, for example, by selective epitaxy, and by implantation, diffusion or in-situ doping of electrical dopants of the first conductivity type into the deposited semiconductor portion.

Figure 6:
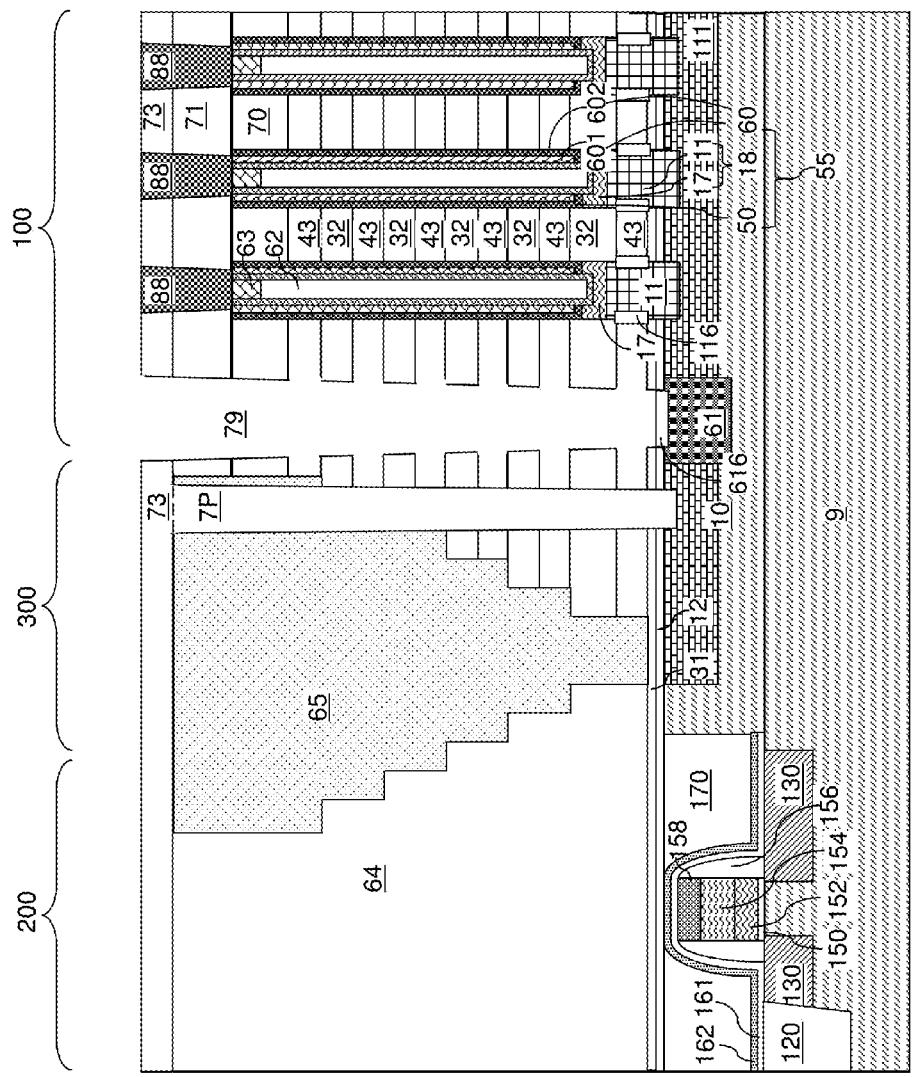
FIG. 6 is a vertical cross-sectional view of the exemplary structure after formation of backside recesses according to the first embodiment of the present disclosure.

Referring to FIG. 6, an etchant that selectively etches the second material of the sacrificial material layers 42 with respect to the first material of the insulating layers 32 can be introduced into the at least one backside trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the memory device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Figure 7:
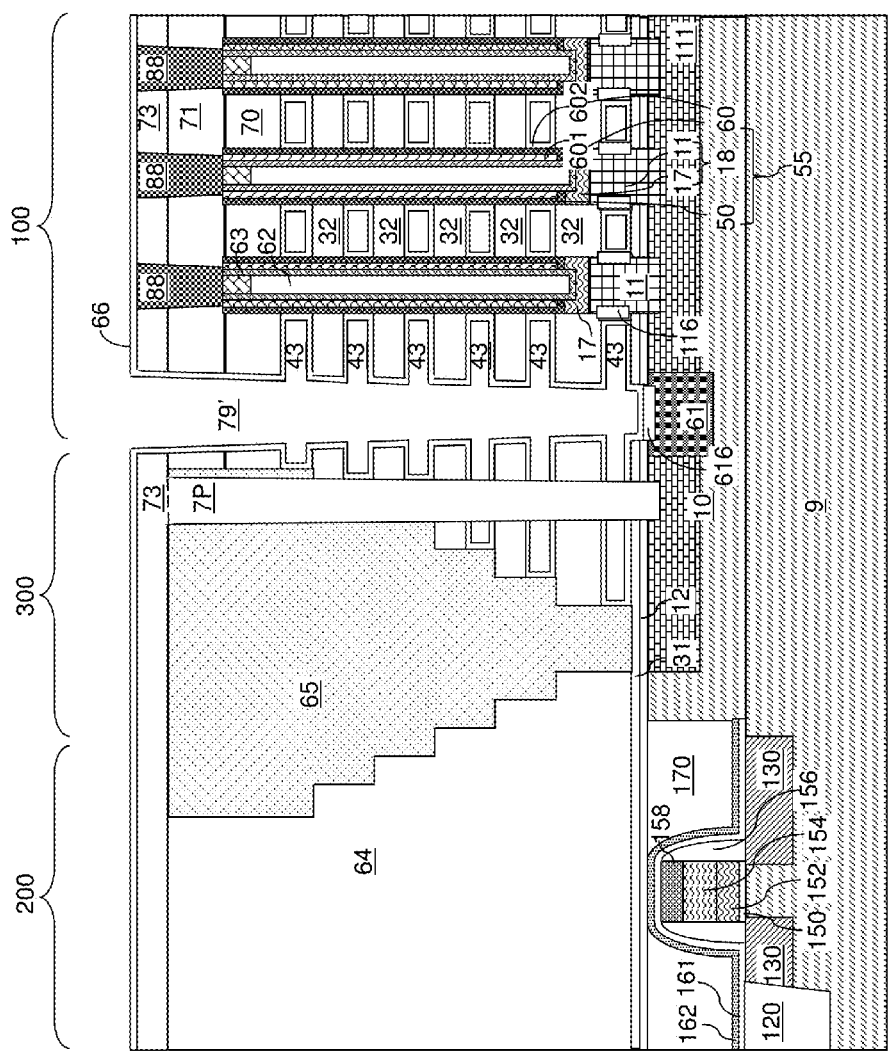
FIG. 7 is a vertical cross-sectional view of the exemplary structure after formation of a backside blocking dielectric layer according to the first embodiment of the present disclosure.

Referring to FIG. 7, a backside blocking dielectric layer 66 can be optionally formed. The backside blocking dielectric layer 66 comprises a dielectric material that functions as a control gate dielectric for the control gates to be subsequently formed in the backside recesses 43. In case the at least one blocking dielectric layer (501, 503) is present within each memory opening, the backside blocking dielectric layer 66 is optional. In case the at least one blocking dielectric layer (501, 503) is omitted, the backside blocking dielectric layer 66 is present.

The dielectric material of the backside blocking dielectric layer 66 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. The backside blocking dielectric layer 66 can be deposited by a conformal deposition method such as chemical vapor deposition or atomic layer deposition. The thickness of the backside blocking dielectric layer 66 can be in a range from 1 nm to 10 nm, although lesser and greater thicknesses can also be employed. The backside blocking dielectric layer 66 is formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of a bridging region 61 (if formed prior to formation of the backside blocking dielectric layer 66). A backside cavity 79' is present within the portion of each backside via trench 79 that is not filled with the backside blocking dielectric layer 66.

Figure 8:
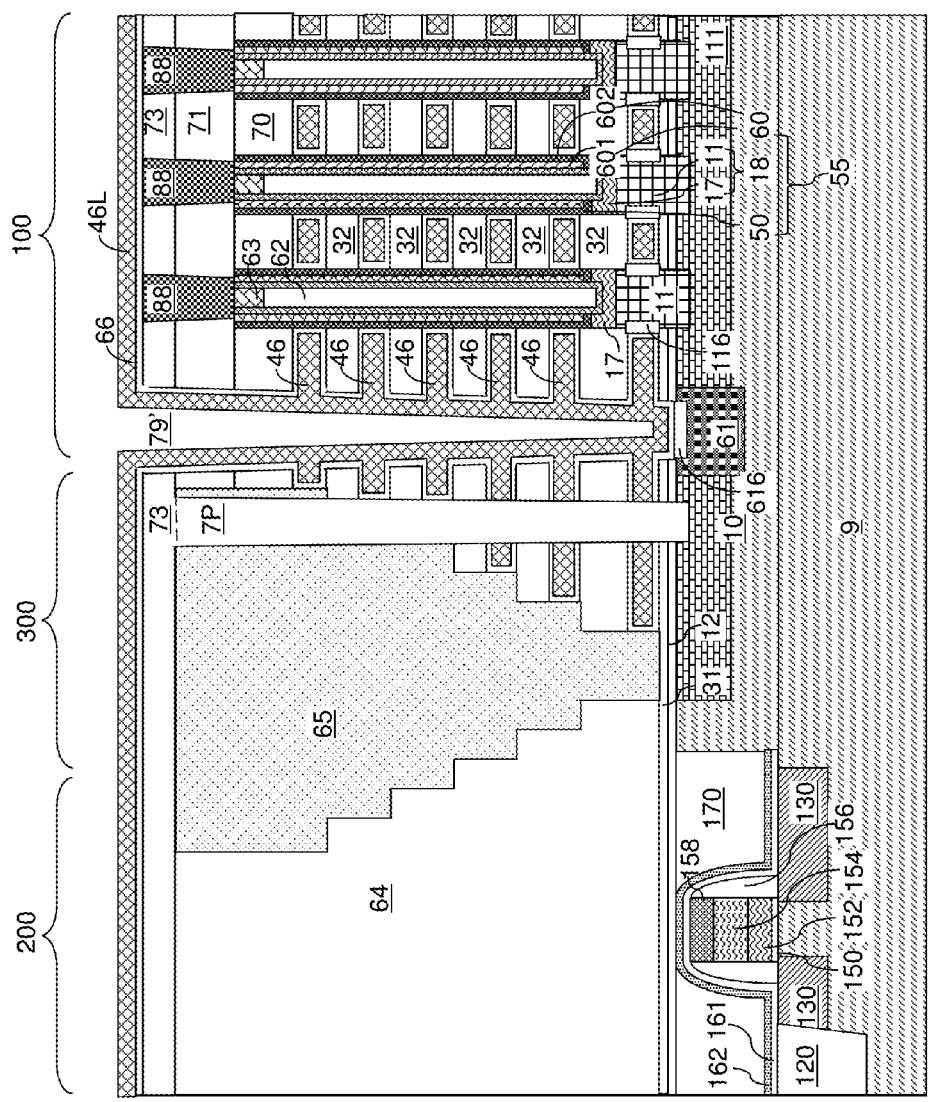
FIG. 8 is a vertical cross-sectional view of the exemplary structure after formation of electrically conductive layers according to the first embodiment of the present disclosure.

Referring to FIG. 8, at least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a contiguous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer 66 and the contiguous metallic material layer 46L. A dielectric spacer 116 laterally surrounds a semiconductor portion that underlies the lower doped semiconductor portion, wherein one of the electrically conductive layers laterally surrounds the dielectric spacer upon formation of the electrically conductive layers.

Figure 9:
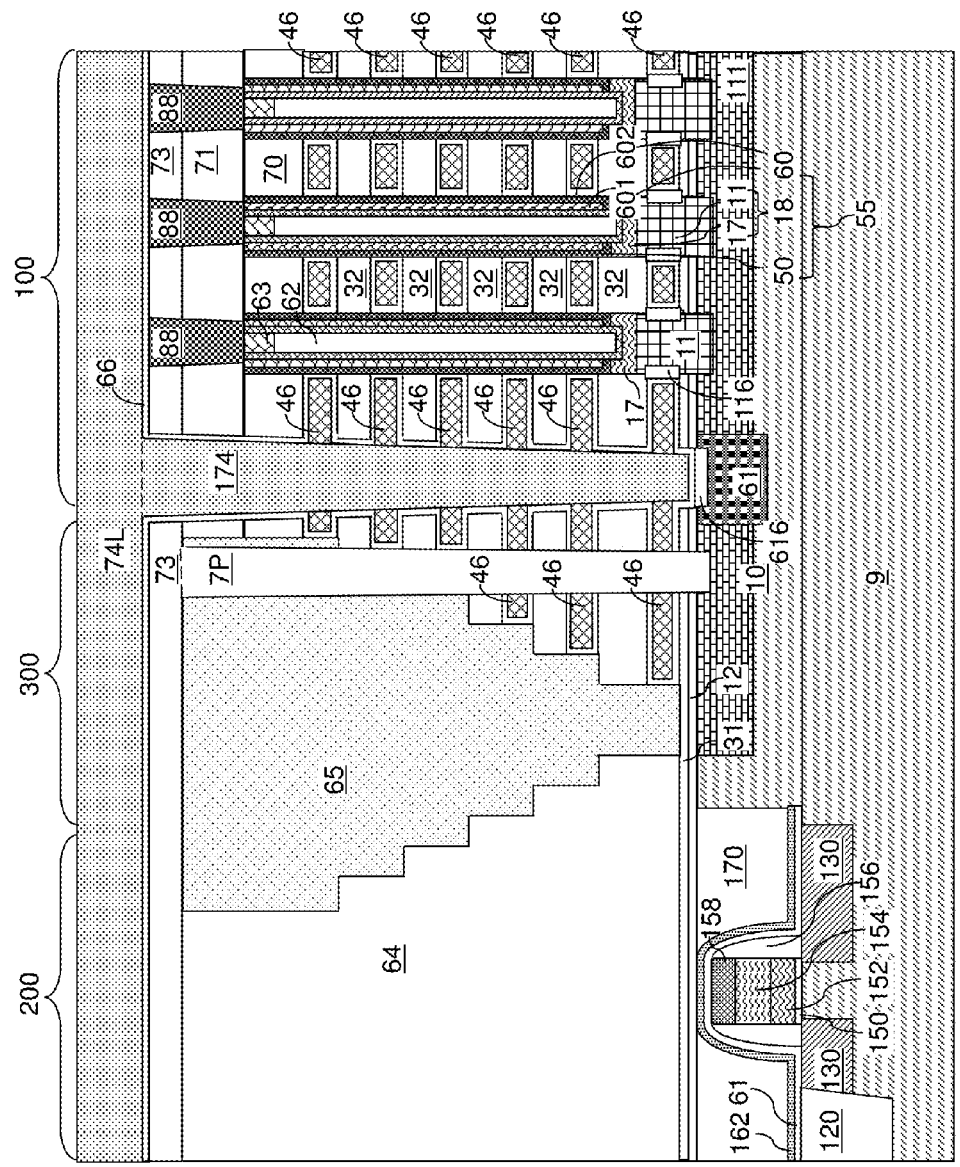
FIG. 9 is a vertical cross-sectional view of the exemplary structure after removal of a conductive material from inside the backside trench and filling the backside trench with a dielectric fill material according to the first embodiment of the present disclosure.

Referring to FIG. 9, the deposited metallic material of the contiguous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. The sacrificial dielectric portion 616 may be, or may not be, removed from above the source regions 61.

Figure 12A:
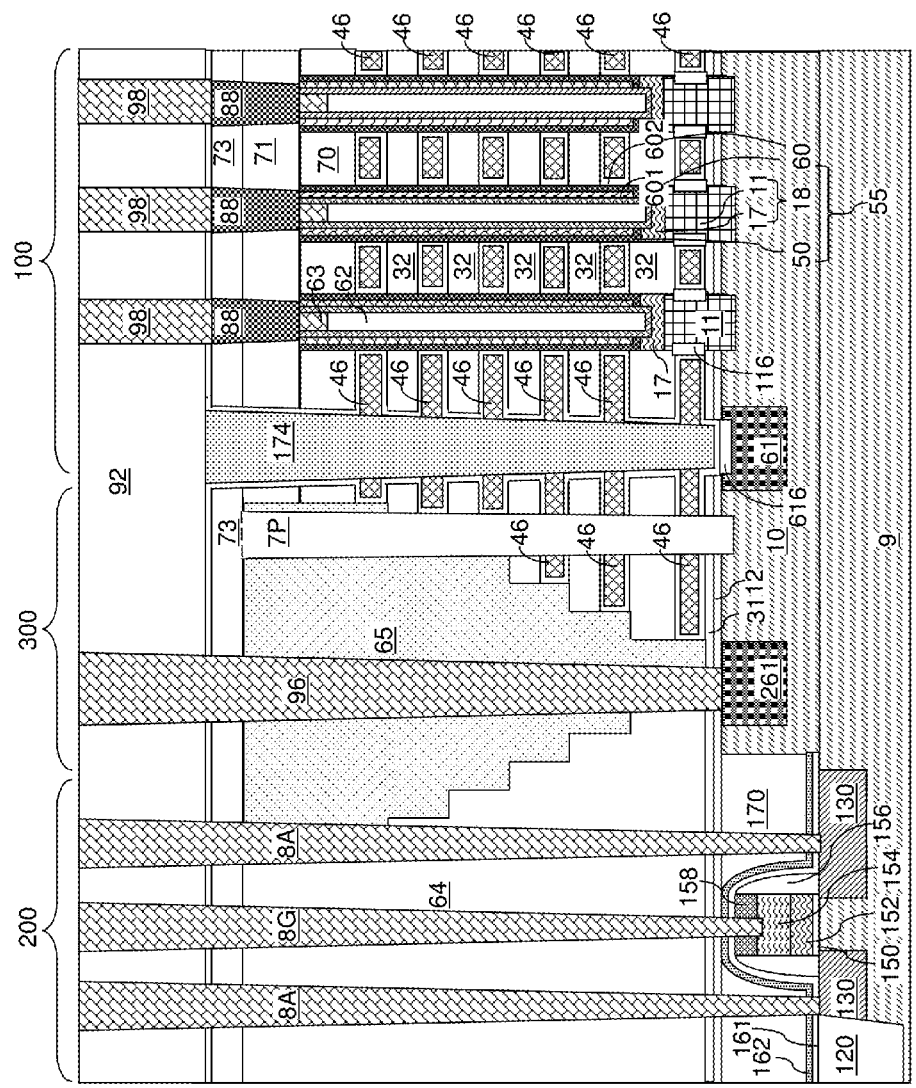
FIG. 12A is a vertical cross-sectional view of a first alternate embodiment of the exemplary structure according to the first embodiment of the present disclosure.

A cavity is present in the backside contact trench 79 after removal of the conductive material from inside the backside contact trench 79. A trench fill dielectric material is deposited in the cavity to fill the entire volume of the cavity. A trench fill dielectric material portion 174 is formed in the backside contact trench 79. The portion of the deposited trench fill dielectric material over a horizontal plane including the topmost surface of the backside blocking dielectric layer 66 (or a horizontal plane including a topmost dielectric material layer in the exemplary structure in case a horizontal portion of the backside blocking dielectric layer 66 is not present over the second contact level dielectric layer 73) constitutes a dielectric material layer, which is herein referred to as a first interconnect dielectric material layer 74L. The dielectric material of the trench fill dielectric material portion 174 and the first interconnect dielectric material layer 74L can comprise silicon oxide, organosilicate glass, silicon nitride, a dielectric metal oxide, or a combination thereof. The trench fill dielectric material portion 174 may be optionally removed above layer 73 as shown in FIG. 12A and described below. Thus, there is no source electrode or electrical contact structure in the trenches 79 which horizontally separate adjacent elongated control gate electrodes 46 in the stack.

Figure 10:
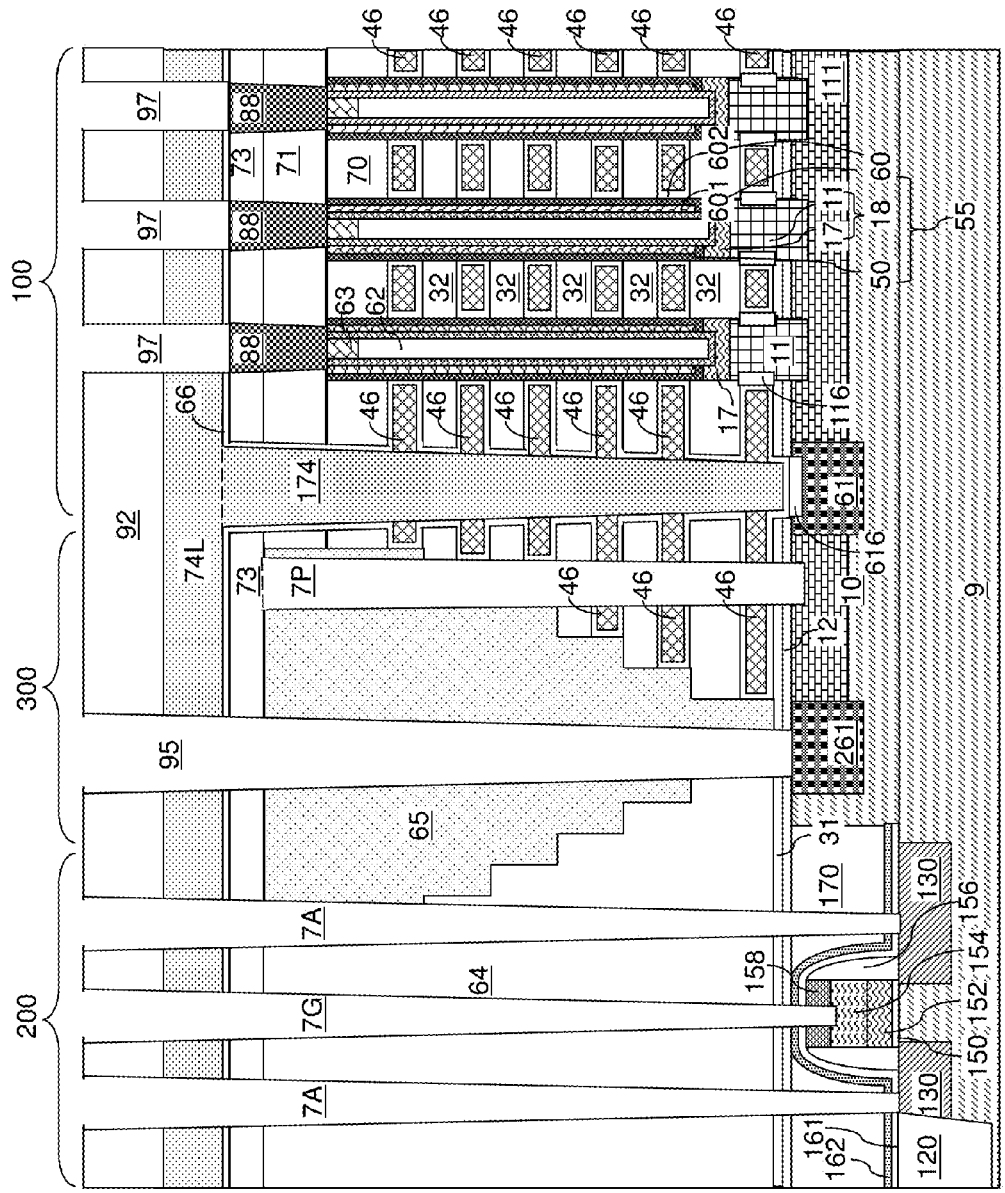
FIG. 10 is a vertical cross-sectional view of the exemplary structure after formation of various contact via cavities according to the first embodiment of the present disclosure.

Referring to FIG. 10, a second interconnect dielectric material layer 92 can be optionally deposited over the first interconnect dielectric material layer 74L. The second interconnect dielectric material layer 92 includes an interlayer dielectric for an interconnect level, which can be, for example, silicon oxide, porous or non-porous organosilicate glass, silicon nitride, a dielectric metal oxide, or a combination thereof. The second interconnect dielectric material layer 92 can be formed, for example, by chemical vapor deposition. The first and second interconnect dielectric material layers (74L, 92) can be employed as dielectric interlay in which metal interconnect structures can be formed.

A photoresist layer (not shown) can be applied over the topmost layer of the exemplary structure (which can be, for example, the second interconnect dielectric material layer 92), and can be lithographically patterned to form various openings. The locations and the shapes of the openings in the peripheral device region 200 can be selected to correspond to electrical nodes of the semiconductor devices in the peripheral device region 200 to be electrically contacted by contact via structures. The locations of the openings within the contact region 300 correspond to areas in which formation of contact via structures for the electrically conductive layers 46 is desired. The locations of the openings within the memory device region 100 can be selected to overlie the memory contact via structures 88 (or portions 63 if structures 88 are formed in a later step).

An anisotropic etch is performed to etch through the various layers overlying the electrical nodes of the semiconductor devices in the peripheral device region 200, the various layers overlying the stepped surfaces at the interface between the alternating stack (32, 46) and the retro-stepped dielectric material portion 65 in the contact region 300, and the various layers overlying the memory contact via structures in the memory device region 100 to form via cavities (i.e., openings).

In the peripheral device region 200, at least one gate via cavity 7G can be formed such that the bottom surface of each gate via cavity is a surface of a gate electrode (152, 154), and at least one active region via cavity 7A can be formed such that the bottom surface of each active region via cavity is a surface of an active region 130. Control gate contact via cavities (not shown) can be formed through the retro-stepped dielectric material portion 65 by transfer of the pattern of the opening by an anisotropic etch. Each control gate contact via cavity can vertically extend to a top surface of a respective electrically conductive layer 46. The control gate contact via cavities can extend to horizontal surfaces within the stepped interface between the retro-stepped dielectric material portion 65 and the alternating stack of the insulator layers 32 and the electrically conductive layers 46. Array contact via cavities (i.e., openings) 97 overlying the memory contact via structures 88 (or portions 63 if structures 88 are formed in a later step) can be formed in the memory device region 100. The well contact via cavity 95 may be formed in any suitable region, such as region 300 to the well 111. If desired, a heavily doped contact region 261 may be formed in the well 111 through the cavity 95 by ion implantation or diffusion. Region 261 may be heavily doped with dopants of the first conductivity type (e.g., p+ doped). The photoresist layer can be subsequently removed, for example, by ashing.

Figure 11:
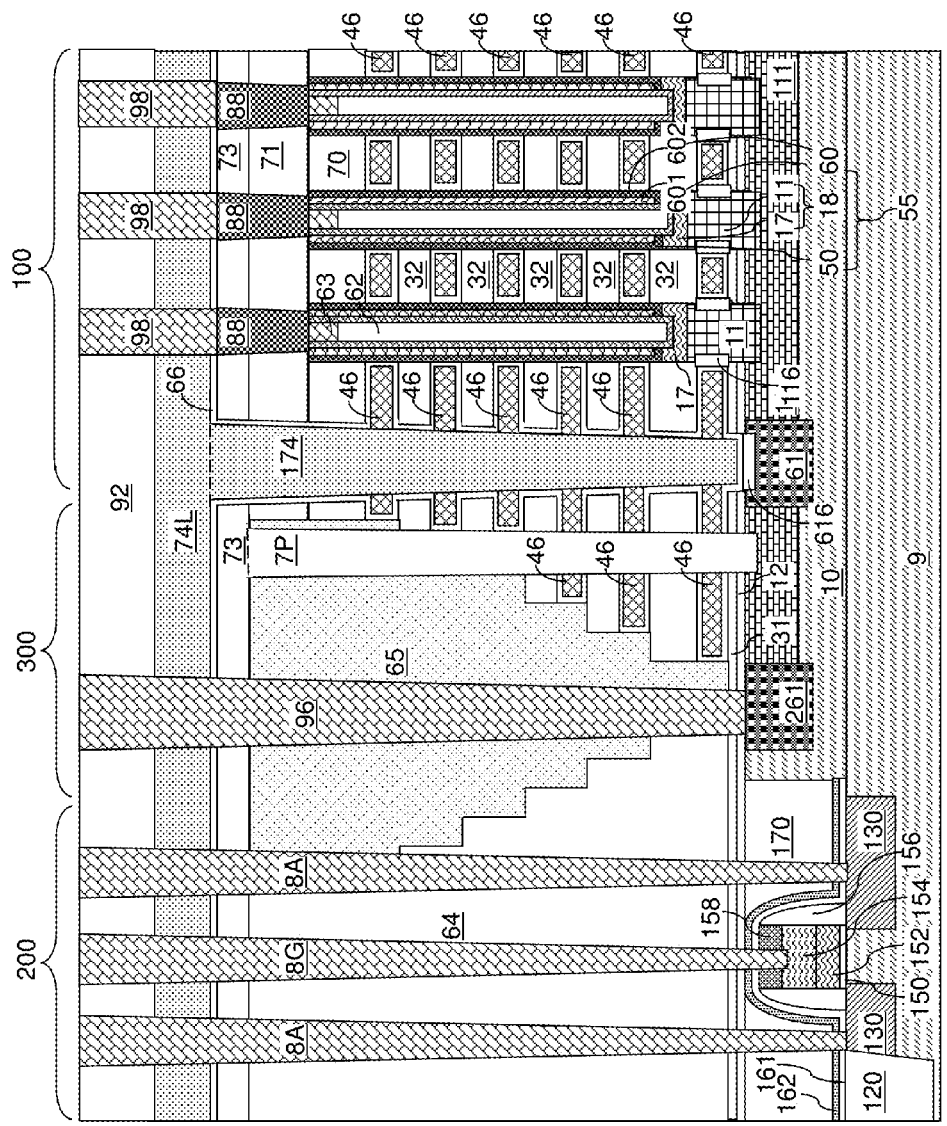
FIG. 11 is a vertical cross-sectional view of the exemplary structure after formation of various contact via structures according to the first embodiment of the present disclosure.

As shown in FIG. 11, the various via cavities (7A, 7G, 95, 97) can be filled with a conductive material to form various contact via structures (8G, 8A, 96, 98). The contact via structures (8G, 8A, 96, 98) can include for example, at least one gate contact via structure 8G and at least one active region contact via structure 8A that are formed in the peripheral device region 200 in via cavities 7G and 7A, respectively, well contact via structure 95 in the well contact via cavity 95, array contact via structures 98 in the via cavities 97 in memory device region 100, and control gate contact via structures (not shown) that are formed in the contact region 300. The at least one gate contact via structure 8G and the at least one active region contact via structure 8A in the peripheral device region 200 provide electrical contact to various nodes of the peripheral devices in the peripheral device region 200. The well contact structure 96 contacts the p-well 111 or the contact region 261 in the well 111. The array contact via structures 98 in the memory device region 100 can contact the memory contact via structures 88 or contact the portion 63 if structures 88 are omitted. The control gate contact via structures in the contact region 300 can provide electrical contact to the electrically conductive layers 46.

Referring to FIG. 12A, a first alternate embodiment of the exemplary structure is shown, which can be derived from the exemplary structure of FIG. 9 by removing the first interconnect dielectric layer 74L by a planarization process. For example, the first interconnect dielectric layer 74L can be removed by a recess etch or chemical mechanical planarization. In this case, the second interconnect dielectric layer 92 can be formed directly on the top surface of the backside blocking dielectric layer 66, the second contact level dielectric layer 73, or the first contact level dielectric layer 71. Thus, the trench fill dielectric material portion 174 does not extend above layer 73.

In a second alternate embodiment, the well 111 may be omitted, as shown in FIG. 12A. In this embodiment, layer 10 acts as the horizontal part of the "source" or "channel" through which a read hole current flows between structures 96 and 98 (i.e., between region 261 and portion 63). The optional bridging region 61 facilitates hole flow below the trench fill dielectric material portion 174.

Figure 12B:
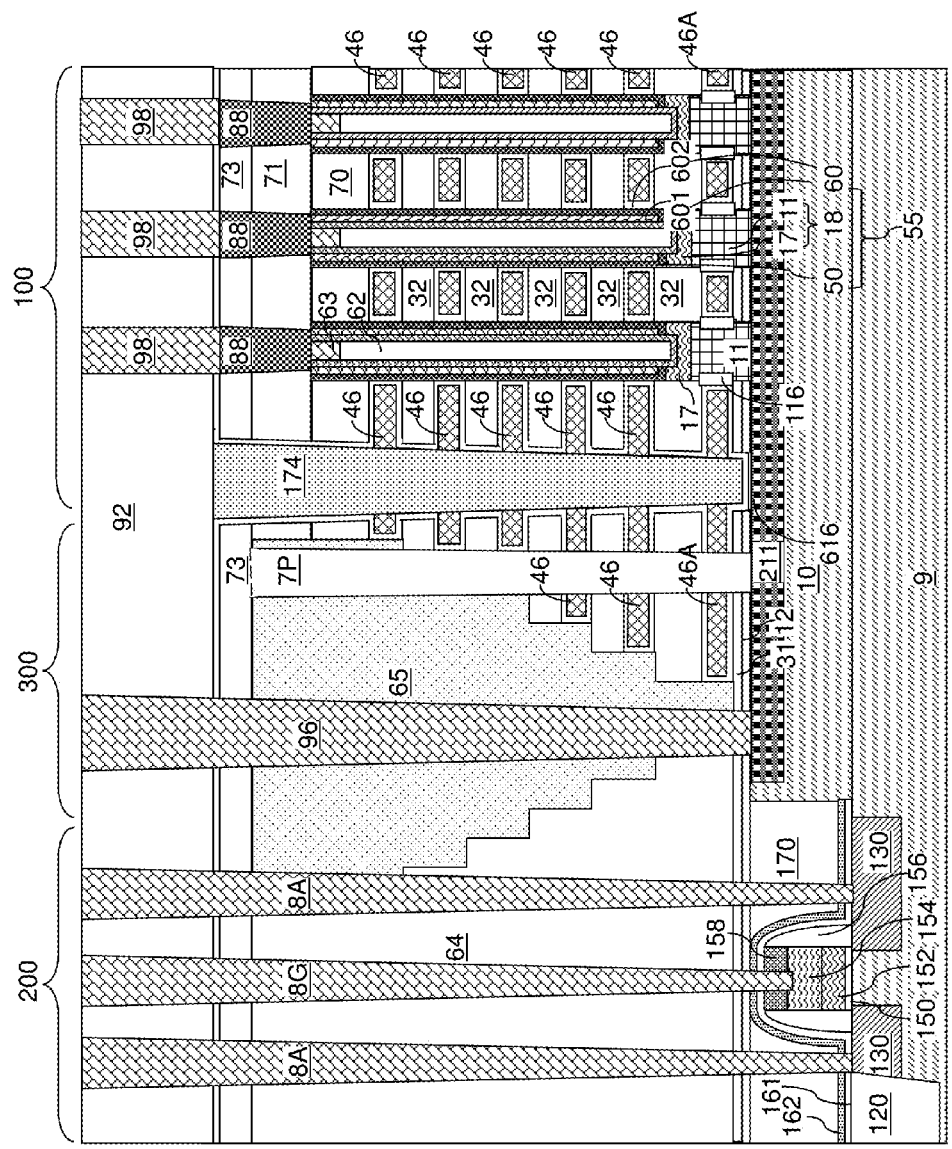
FIG. 12B is a vertical cross-sectional view of a second alternate embodiment of the exemplary structure according to a second embodiment of the present disclosure.

In a third alternate embodiment, the discrete bridging region 61 and/or contact region 261 may be omitted and replaced by an elongated heavily doped 211 of the first conductivity type (e.g., p+ well), as shown in FIG. 12B.

In a fourth alternate embodiment, if the device contains plural lower select gate electrodes at the bottom of the stack, then one or more lower select gate electrodes, such as the bottom select gate electrode 46A shown in FIG. 12B may be omitted. Electrode 46A may be omitted because it is not required to create a depletion region for electron transport through layer 10 in case a hole read current flow through p-well 111, 211 or p-type layer 10 is used during the read operation of the NAND strings.

The exemplary structure, or various alternate embodiments thereof, can comprise a monolithic three-dimensional memory device. The monolithic three-dimensional memory device can comprise a stack of alternating layers (32, 46) comprising insulating layers 32 and electrically conductive layers 46 and located over a substrate (9, 10). The monolithic three-dimensional memory device further comprises a memory stack structure 55 extending through the stack (32, 46). A p-i-n junction structure (17, 60, 63) vertically extends through the stack (32, 46) substantially perpendicular to the top surface (7, 7A) of the substrate (9, 10). The p-i-n junction structure (17, 60, 63) has a lower junction between an intrinsic semiconductor portion 60 and a lower doped semiconductor portion 17 having a doping of a first conductivity type, and has an upper junction between the intrinsic semiconductor portion 60 and an upper doped semiconductor portion 63 having a doping of a second conductivity type. One of the first and second conductivity types is p-type and another of the first and second conductivity types is n-type. Preferably the first conductivity type is p-type and the second conductivity is n-type.

In one embodiment, the intrinsic semiconductor portion 60 can comprise a first polycrystalline semiconductor material, and the upper doped semiconductor portion 63 can comprise a second polycrystalline semiconductor material. In one embodiment, the lower doped semiconductor portion 17 can comprise a single crystalline semiconductor material. In one embodiment, the lower doped semiconductor portion 17 can be in epitaxial alignment with a single crystalline lattice structure of a semiconductor material in the substrate (9, 10). For example, the lower doped semiconductor portion 17 can be in epitaxial alignment with the single crystalline lattice structure of the doped semiconductor well 111 in the substrate.

An epitaxial material portion, as embodied as an epitaxial pedestal 11, can underlie the lower doped semiconductor portion 17. The epitaxial pedestal 11 can have a doping of the first conductivity type at a lower dopant concentration than the lower doped semiconductor portion 17. The epitaxial pedestal 11 can be in epitaxial alignment with the single crystalline lattice structure of a semiconductor material in the substrate (9, 10, 11, 61) such as the doped semiconductor well 111.

In one embodiment, the substrate (9, 10) can comprise a doped semiconductor well 111 contacting the epitaxial material portion (as embodied as the epitaxial pedestal 11) having a doping of the first conductivity type. In one embodiment, the doped semiconductor well 111 has a doping of the first conductivity type at a higher dopant concentration than the dopant concentration in the epitaxial pedestal 11. The substrate (9, 10) can further comprise a first conductivity type doped semiconductor region (as embodied as the semiconductor material layer 10) located underneath a top surface 7A of the substrate (9, 10), contacting the doped semiconductor well 111, and vertically spaced from the epitaxial pedestal 11 by a region of the doped semiconductor well 111.

In one embodiment, a dielectric spacer 116 can laterally surround the epitaxial pedestal 11. At least one of the electrically conductive layers 46 can laterally surround the dielectric spacer 116.

In one embodiment, the lower junction can be located at an interface between a polycrystalline semiconductor material portion comprising the intrinsic semiconductor portion 60 and a single crystalline semiconductor material portion comprising the lower doped semiconductor portion 17. In one embodiment, the lower junction can be located above a bottommost electrically conductive layer 46 (e.g., lower select gate electrode) among the electrically conductive layers 46 within the stack of alternating layers (32, 46). Alternatively, if the lowest select gate electrode 46A is omitted, then the lower junction is located below the remaining bottommost electrically conductive layer 46 (e.g., remaining lowest select gate electrode).

In one embodiment, a trench vertically extends from a first horizontal plane including a topmost surface of the stack of alternating layers (32, 46) to a second horizontal plane including a bottommost surface of the stack of alternating layers (32, 46). A trench fill dielectric material portion 174 is located in the trench, preferably completely fills the trench, and contacts a sidewall of each of the electrically conductive layers 46.

In one embodiment, the memory stack structure 55 can be located within a memory opening extending through the stack of alternating layers and comprises a memory film 50 that contacts a sidewall of the memory opening. In one embodiment, the memory film 50 comprises, from outside to inside, a blocking dielectric layer (501, 503), a memory material layer 504, and a tunneling dielectric layer 506.

In one embodiment, the monolithic three-dimensional memory device comprises a vertical NAND device located over the substrate (9, 10). The electrically conductive layers 46 comprise, or are electrically connected to, a respective word line of the vertical NAND device. The substrate can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND strings. The silicon substrate can contain an integrated circuit comprising a driver circuit for the memory device located thereon.

In one embodiment, the array of monolithic three-dimensional NAND strings can comprise a plurality of semiconductor channels (60), wherein at least one end portion of each of the plurality of semiconductor channels extends substantially perpendicular to a top surface of the substrate. The array of monolithic three-dimensional NAND strings can comprise a plurality of charge storage elements. Each charge storage element can be located adjacent to a respective one of the plurality of semiconductor channels. The array of monolithic three-dimensional NAND strings can comprise a plurality of control gate electrodes (as embodied as a subset of electrically conductive layers 46) having a strip shape extending substantially parallel to the top surface of the substrate. The plurality of control gate electrodes can comprise at least a first control gate electrode located in the first device level and a second control gate electrode located in the second device level.

In one embodiment, the monolithic three-dimensional memory device of the present disclosure can be programmed to store data by storing electrical charge in memory elements within the memory stack structure 55. The data can be read by measuring electrical current passing through the p-i-n junction structure (17, 60, 63). Preferably, a hole current (i.e., flow of holes) flowing from the lower doped semiconductor portion 17 through the channel 60 to the upper doped semiconductor portion 63 is used during the read operation. The charge carriers of the first conductivity type (e.g. holes) can be supplied from the doped well region 111 or contact region 261, if present, and flow from the doped well region 111 or region 261 to the epitaxial pedestal 11, and then to the lower doped semiconductor portion 17, and then to the intrinsic semiconductor portion (i.e., channel) 60, and into the upper doped semiconductor portion 63. The doped well region 111 and/or contact region 261, the epitaxial pedestal 11, and the lower doped semiconductor portion 17 can have a doping of the first conductivity type such that the dopant concentration in the epitaxial pedestal 11 is lower than the dopant concentration in the doped well region 111 or contact region 261, and/or is lower than the dopant concentration in the lower doped semiconductor region 17.

The lower doped semiconductor portion 17 can have a greater dopant concentration than the epitaxial pedestal 11 to provide Ohmic contact between the intrinsic semiconductor portion 60 and the epitaxial pedestal 11. The lower doped semiconductor portion 17 can be conductive, i.e., can be degenerately doped to have electrical conductivity greater than $1.0 \times 10^5$ S/cm. The epitaxial pedestal 11 can have a lesser dopant concentration than the lower doped semiconductor portion 17 and the doped semiconductor well 111 so that the epitaxial pedestal is semiconducting, i.e., have electrical conductivity in a range between $1.0`10^{-6}$ S/cm to $1.0 \times 10^5$ S/cm, and the current flow through the epitaxial pedestal is controlled by the at least one electrically conductive layer 46A laterally surrounding the dielectric spacer 116 (unless the select gate electrode 46 is omitted). The doped semiconductor well 111 can have a greater dopant concentration than the epitaxial pedestal 11 to provide low electrical resistance. Because the doped semiconductor well 111 functions as a source line that provides electrical charge carriers of the first conductivity type for conduction of electrical current through the p-i-n junction structure (17, 60, 63), low resistance of the doped semiconductor well 111 can increase the on-current through the p-i-n junction structure (17, 60, 63).

Figures 13A, 13B:
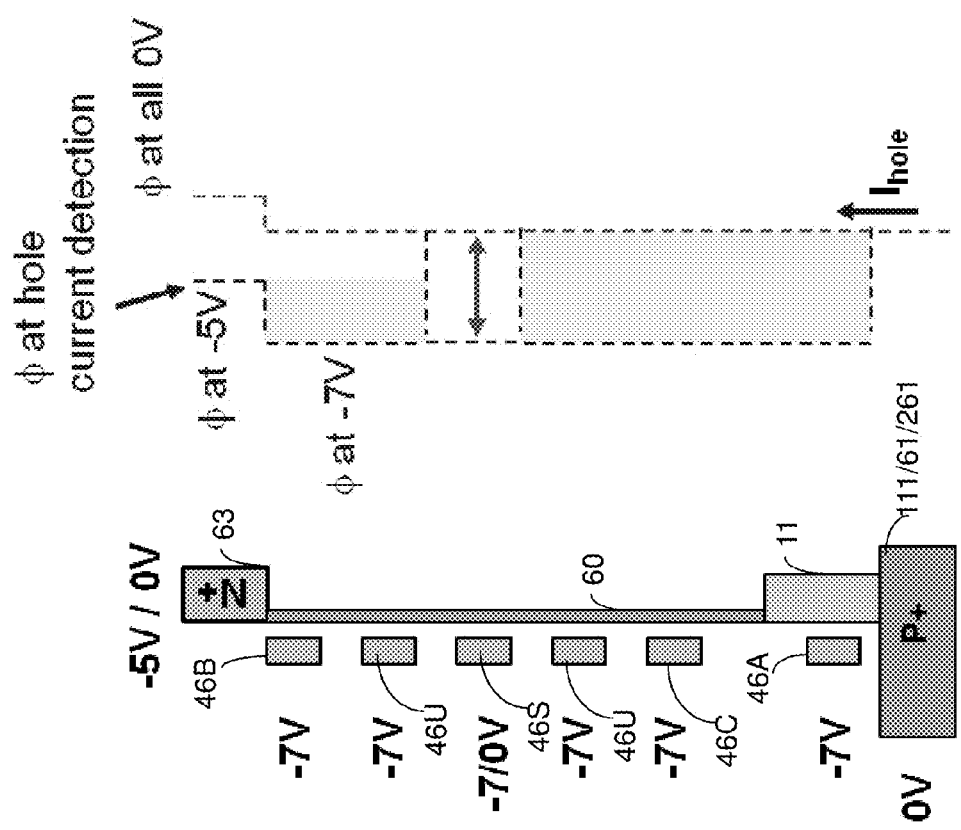
FIG. 13A is a schematic diagram of an exemplary device illustrating exemplary voltages applied during a read operation of the device and FIG. 13B is a schematic diagram illustrating distribution of holes during operation of the exemplary device of FIG. 13A.

Referring to FIG. 13A, an exemplary bias setting for hole current detection is illustrated for the case in which the first conductivity type is p-type and the second conductivity type is n-type. Programming and erasing of the memory elements in the memory stack structure 55 can be performed by inducing electron injection from the intrinsic semiconductor portion 60 into the memory elements in the memory film 50 through the electrical bias applied to appropriate electrically conductive layers (i.e., control gate electrodes) 46 via Fowler-Nordheim electron tunneling, hot electron injection and/or gate induced drain leakage (GIDL) where holes are created in the channel by a positive bias on control gate electrodes followed by applying a negative bias to the control gate electrodes to draw holes into the memory film to recombine with electrons trapped in the memory film to remove charge. Furthermore, electrons may be injected into the channel 60 from the portion (e.g., drain) 63 during an inhibit operation.

During a read operation, the doped semiconductor well 111 can be electrically grounded, i.e., can be biased at 0 V. When a memory stack structure 55 is not selected for the read operation, a bias voltage of 0 V can be applied to the upper doped semiconductor portion 63 from a bit line (e.g., structure 98 or additional overlying line connected to structure 98). When a memory stack structure 55 is selected to read contents of the memory elements in the memory film 50, the upper doped semiconductor portion 63 can be electrically biased at a negative voltage with respect to a bias of the substrate, such as −5V from a bit line. The electrically conductive layers 46A, 46B, 46C employed as select gate electrodes (for example, the electrically conductive layers 46A laterally surrounding the dielectric spacer 116) can be electrically biased at a turn-on voltage such as −7 V, which turns on the epitaxial channel 11 for electrical conduction by holes. The unselected control gate electrodes (as embodied as electrically conductive layers 46U laterally surrounding the intrinsic semiconductor portion 60) are electrically biased at a negative (with respect to the bias of the substrate) turn-on voltage, such as −7V, which turns on the portions of the intrinsic semiconductor portion 60 at the level of the unselected control gate electrodes. The selected control gate electrode(s) 46S can be electrically biased at a select voltage, which can be 0 V. The Fermi energy for holes and the corresponding hole distribution are illustrated for the cases of electrically biasing the upper doped semiconductor portion 63 at 0 V and at −5 V in FIG. 13B.

The device of the present disclosure employs the majority charge carriers of the doped well region 111, the epitaxial pedestal 11, and the lower doped semiconductor portion 17 as the charge carriers employed to conductive the predominant portion of electrical current through the intrinsic semiconductor portion 60 during the read operation. As such, there is no need to provide a doped region of a second conductivity type (such as a source region in prior art structures) near each set of the memory stack structure 55. Therefore, a large metal contact via structure filling a contact via cavity 79 is not necessary, and the contact via cavity 79 can be filled with a dielectric fill material portion 174. The trenches 79 containing the dielectric fill material portion 174 may be narrower than prior art trenches 79 since there is no source electrode/contact via structure located therein. This increases the active device area, decreases the manufacturing cost per string and avoid possible short circuits between the control gates 46 and the source electrode. Further, since a large metal contact via structure (e.g., tungsten structure) is not needed in proximity to each set of the memory stack structures 55 surrounded by the control gate "fingers", mechanical stress from a large metal contact via structure can be avoided in the structure of the present disclosure. The decrease in stress decreases undesirable substrate warpage. Thus, the present disclosure provides a three-dimensional memory structure that has less mechanical stress than prior art structures employing a p-n-p transistor structure or an n-p-n transistor structure and uses one common well via contact structure 96 for plural sets of memory structures 55.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
a stack of alternating layers comprising insulating layers and electrically conductive layers and located over a substrate; and
a memory stack structure extending through the stack and comprising a memory film and a semiconductor p-i-n junction structure vertically extending through the stack substantially perpendicular to a top surface of the substrate;
wherein the semiconductor p-i-n junction structure has a lower junction between an intrinsic semiconductor portion and a lower doped semiconductor portion having a doping of a first conductivity type, and an upper junction between the intrinsic semiconductor portion and an upper doped semiconductor portion having a doping of a second conductivity type; and
wherein one of the first and second conductivity types is p-type and another of the first and second conductivity types is n-type.

2. The monolithic three-dimensional memory device of claim 1, wherein:
the first conductivity type is p-type and the second conductivity type is n-type;
the intrinsic semiconductor portion comprises a first polycrystalline semiconductor material;
the upper doped semiconductor portion comprises a second polycrystalline semiconductor material;
the lower doped semiconductor portion comprises a single crystalline semiconductor material; and
the lower doped semiconductor portion is in epitaxial alignment with a single crystalline lattice structure of a semiconductor material in the substrate.

3. The monolithic three-dimensional memory device of claim 2, further comprising an epitaxial material portion underlying the lower doped semiconductor portion and having a doping of the first conductivity type at a lower dopant concentration than the lower doped semiconductor portion.

4. The monolithic three-dimensional memory device of claim 3, wherein:
the epitaxial material portion is in epitaxial alignment with a single crystalline lattice structure of a semiconductor material in the substrate; and
the substrate comprises a doped semiconductor well contacting the epitaxial material portion and having a doping of the first conductivity type at a higher dopant concentration than a dopant concentration in the epitaxial material portion; and the substrate comprises a first conductivity type doped semiconductor region located underneath a top surface of the substrate, contacting the doped semiconductor well, and vertically spaced from the epitaxial material portion by a region of the doped semiconductor well.

5. The monolithic three-dimensional memory device of claim 3, further comprising a dielectric spacer laterally surrounding the epitaxial material portion, wherein one of the electrically conductive layers laterally surrounds the dielectric spacer.

6. The monolithic three-dimensional memory device of claim 1, wherein the lower junction is located at an interface between a polycrystalline semiconductor material portion comprising the intrinsic semiconductor portion and a single crystalline semiconductor material portion comprising the lower doped semiconductor portion.

7. The monolithic three-dimensional memory device of claim 1, wherein the lower junction is located above or below a bottommost electrically conductive layer among the electrically conductive layers within the stack of alternating layers.

8. The monolithic three-dimensional memory device of claim 1, further comprising:
a trench vertically extending from a first horizontal plane including a topmost surface of the stack of alternating layers to a second horizontal plane including a bottommost surface of the stack of alternating layers; and
a trench fill dielectric material portion which completely fills the trench and contacts a sidewall of each of the electrically conductive layers.

9. The monolithic three-dimensional memory device of claim 1, wherein:
the memory stack structure is located within a memory opening extending through the stack of alternating layers;
the memory film contacts a sidewall of the memory opening; and
the memory film comprises, from outside to inside, a blocking dielectric layer, a memory material layer, and a tunneling dielectric layer.

10. The monolithic three-dimensional memory device of claim 1, wherein:
the monolithic three-dimensional memory device comprises a vertical NAND device located over the substrate;
the electrically conductive layers comprise, or are electrically connected to, a respective word line of the vertical NAND device;
the substrate comprises a silicon substrate;
the vertical NAND device comprises an array of monolithic three-dimensional NAND strings located over the silicon substrate;
at least one memory cell in a first device level of the three-dimensional array of NAND strings is located over another memory cell in a second device level of the three-dimensional array of NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *